United States Patent [19]

Mehta

[11] Patent Number: 5,134,321
[45] Date of Patent: Jul. 28, 1992

[54] POWER MOSFET AC POWER SWITCH EMPLOYING MEANS FOR PREVENTING CONDUCTION OF BODY DIODE

[75] Inventor: Pran N. Mehta, Rockaway, N.J.
[73] Assignee: Harris Corporation, Melbourne, Fla.
[21] Appl. No.: 644,569
[22] Filed: Jan. 23, 1991
[51] Int. Cl.⁵ .................................. H03K 17/687
[52] U.S. Cl. .............................. 307/571; 307/491; 307/242
[58] Field of Search ............ 307/491, 571, 304, 242, 307/246, 248, 244

[56] References Cited

U.S. PATENT DOCUMENTS

| | | | |
|---|---|---|---|
| 3,407,358 | 10/1968 | Ott | 307/244 |
| 3,495,097 | 2/1970 | Abramson et al. | 307/571 X |
| 4,316,101 | 2/1982 | Minner | 307/304 X |
| 4,355,343 | 10/1982 | Gross | 307/632 |
| 4,443,885 | 4/1984 | van Roermund | 307/304 |
| 4,683,387 | 7/1987 | Jones et al. | 307/571 |
| 4,992,683 | 2/1991 | Robin, Jr. | 307/571 X |

FOREIGN PATENT DOCUMENTS 0093322 7/1980 Japan ........................... 307/57

Primary Examiner—Stanley D. Miller
Assistant Examiner—Toan Tran
Attorney, Agent, or Firm—Watov & Kipnes

[57] ABSTRACT

A control circuit for coupling an AC (alternating current) source to a load comprises a MOSFET transistor having source and drain electrodes with a main conductor channel therebetween and a control electrode for controlling conduction ibn the main conduction channel. The control circuit further comprises a capacitor arrangement, the MOSFET transistor having the main conduction channel thereof coupled with the capacitor arrangement in a series circuit for coupling therethrough the AC source to the load.

5 Claims, 4 Drawing Sheets

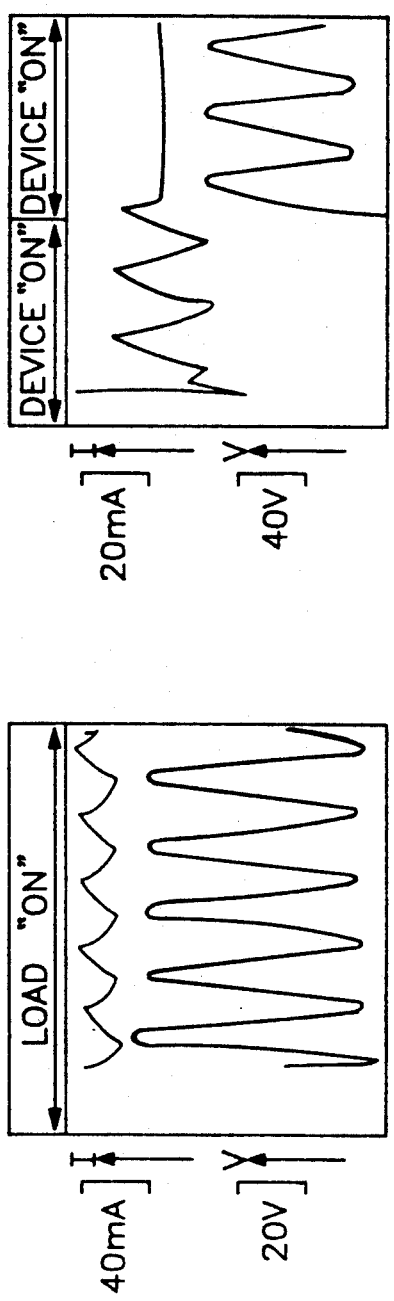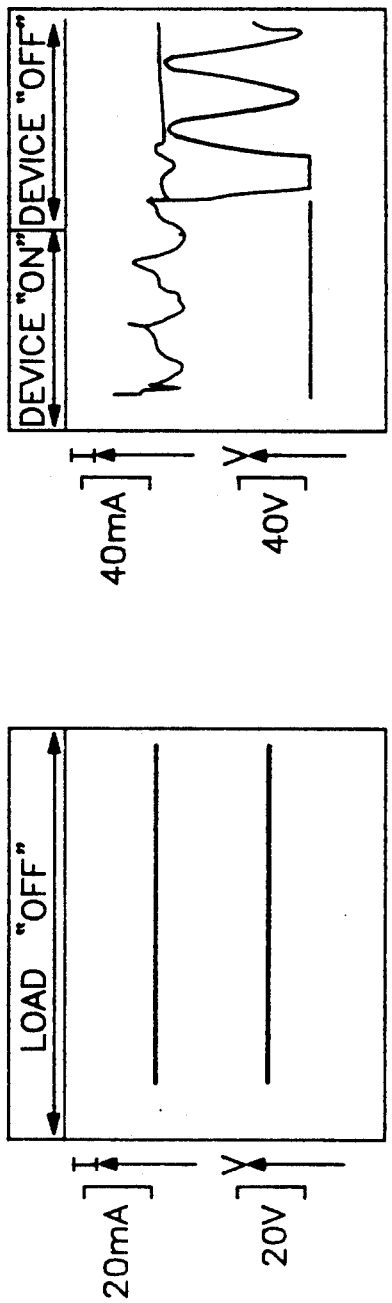

POWER MOSFET AC POWER SWITCH EMPLOYING MEANS FOR PREVENTING CONDUCTION OF BODY DIODE

FIELD OF THE INVENTION

The present invention relates to electronic semiconductor switches for AC power circuits, and more particularly to power switches utilizing MOSFET transistors (metal oxide semiconductor field effect transistors) for AC switching.

BACKGROUND OF THE INVENTION

Power MOSFET transistors find application as switches in AC circuits. The conduction channel of a MOSFET transistor is able to conduct AC current in a bidirectional manner as is required of an AC switch; however, a commonly used construction for MOSFET transistors results in a parasitic or "body diode" being formed in the device. The body diode appears as, in effect, a diode connected between the drain and source regions of the MOSFET transistor. In an N-channel MOSFET transistor, for example, the body diode appears in a polarity sense to allow conduction from the source region into the drain region that is, in a sense opposite to that which would be considered the "normal" direction of current flow through an N-channel MOSFET transistor.

MOSFET transistors are relatively inexpensive devices in comparison with other available devices for controlling current in AC power circuits, such as triacs, for example, and accordingly it is desirable to utilize them in that capacity. It is furthermore herein recognized to be desirable to achieve satisfactory operation as an AC power switch with a single MOSFET transistor.

When a MOSFET transistor is utilized for controlling current flow in an AC circuit, conduction in one polarity sense can be shut off by the normal action of the control gate electrode; however, conduction in the opposite polarity sense cannot be prevented by action of the control gate electrode because the conduction channel, even when made non-conductive, is bypassed or shunted by the body diode conducting and, in effect, the device as seen from its terminals, is not shut off.

Prior art techniques for utilizing MOSFET transistors in AC power switching applications have included utilizing a second MOSFET transistor to block the action of the body diode or else full wave bridge rectifier-type configurations have been used. As a result, extra semiconductor devices are required, thus increasing the cost so that no very significant advantage is obtainable in comparison with a triac, for example.

SUMMARY OF THE INVENTION

In accordance with one embodiment of the invention, a control circuit for coupling an AC (alternating current) source to a load comprises a MOSFET transistor and a capacitor means. The MOSFET has source and drain electrodes with a main conduction channel therebetween and a control electrode for controlling conduction in the main conduction channel. The capacitor means is connected in series with the main conduction channel of the MOSFET for coupling therethrough the AC source to the load.

In accordance with another embodiment of the invention, the capacitor means comprises a first capacitor connected in series with the main conduction path of the MOSFET transistor.

In accordance with still another embodiment of the invention, the capacitor means comprises a first diode coupled in a parallel combination with the first capacitor.

In accordance with yet another embodiment of the invention, the MOSFET transistor exhibits a parasitic diode connection between the source and drain electrodes and the first diode is connected for conduction in an opposite polarity sense to that of the parasitic diode.

In accordance with still another embodiment of the invention, the capacitor arrangement comprises a second capacitor connected in series with the parallel combination of the first diode and the first capacitor.

In accordance with a further embodiment of the invention, the capacitor arrangement comprises a second diode coupled in a parallel combination with the second capacitor.

In accordance with still a further embodiment of the invention, the first and second diodes are connected back to back (for conduction in opposite directions of current flow).

BRIEF DESCRIPTION OF THE DRAWINGS

The invention will next be described with the aid of the drawing in which like items are indicated by the same reference designation, and in which:

FIGS. 5 through 8 show various oscillograms of waveforms pertaining to embodiments of the invention, helpful to an understanding to the invention.

DETAILED DESCRIPTION OF THE PREFERRED EMBODIMENTS OF THE INVENTION

Figure 1:
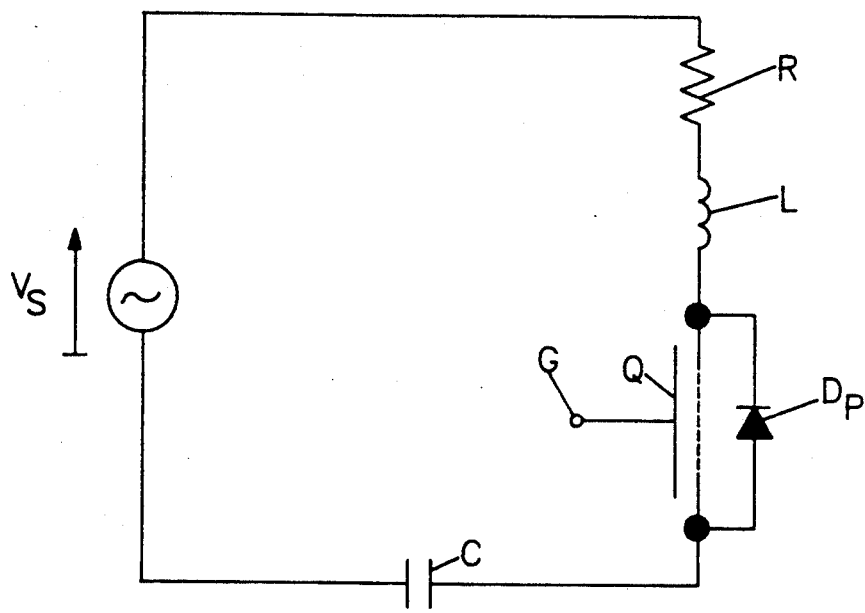
FIGS. 1, 3, 4, 9, and 10 show schematic diagrams of various embodiments in accordance with the invention.

In the embodiment shown in FIG. 1, a load comprises an inductance L connected at one terminal to one terminal of a resistance R. Resistance R may be a resistor or it may represent a resistive component of inductance L. Inductance L may, for example, represent the self-inductance of an energizing winding on a relay or a solenoid actuator. A power MOSFET transistor Q has one end of its main conduction channel, shown by a dashed line, connected to the other terminal of inductance L. Conduction in the conduction channel is controlled by a gate control electrode, shown connected to a control terminal G. The other end of the conduction channel is connected to one terminal of a capacitor C. The other terminal of resistance R and the other terminal of capacitor C are connected to respective terminals of a source of an AC (alternating current) voltage $V_S$. A parasitic diode which is formed in the process of making MOSFET transistor Q is shown as a diode $D_P$ connected between the source and drain electrodes of MOSFET transistor Q.

In operation, assume first that MOSFET transistor Q is biased into a non-conductive state by an appropriate gate bias voltage. When the polarity of the AC signal is positive (positive at the voltage arrow-head), no current can flow in the circuit since MOSFET transistor Q is biased off and diode $D_P$ is reverse biased by the AC voltage. When the AC voltage is negative, conduction takes place through diode $D_P$ and capacitor C becomes charged, with its plate which is connected to the conduction channel of MOSFET transistor Q becoming negative charged relative to its other plate which is connected to the AC source. Within one or more AC cycles, depending on the circuit time constant, capacitor C will rapidly become fully charged substantially to the peak value of the AC voltage being applied and conduction through parasitic diode $D_P$ will substantially cease. Thus, when MOSFET transistor Q is biased off, substantially no AC current flows in the load after the charging transient is over.

When MOSFET transistor Q is biased into a conductive state, its channel will conduct AC current through the load, resistance R and inductance L, and through capacitor C. The circuit impedance will be changed by the presence of capacitor C as compared to without capacitor C. This can be used to advantage in improving the lagging power factor of the inductive load circuit comprising inductance L and resistance R. Furthermore, the ON resistance of the conduction of MOSFET transistor Q should be as small as possible to keep its effect on the circuit power factor.

In the circuit of FIG. 1, MOSFET transistor Q is subjected in the off condition to a maximum voltage substantially equal to the DC charge voltage on capacitor C plus the peak voltage of the AC voltage being applied. Altogether then, MOSFET transistor Q is required to withstand twice the peak voltage of the applied AC voltage, that is $2\sqrt{2}.V_{RMS}$. A circuit calculation is provided in the Appendix.

Capacitor C is charged to maximum DC voltage of $2\sqrt{2}.V_{RMS}$ during the time MOSFET transistor Q is in an OFF condition. However, when MOSFET transistor Q is in a conducting condition, capacitor C is required to conduct AC. This is not a problem if an appropriate type of capacitor, such as a ceramic AC type, is employed for capacitor C However, such ceramic AC capacitors are expensive and it is desirable to use a less expensive type of capacitor, such as an electrolytic capacitor.

Figure 3:
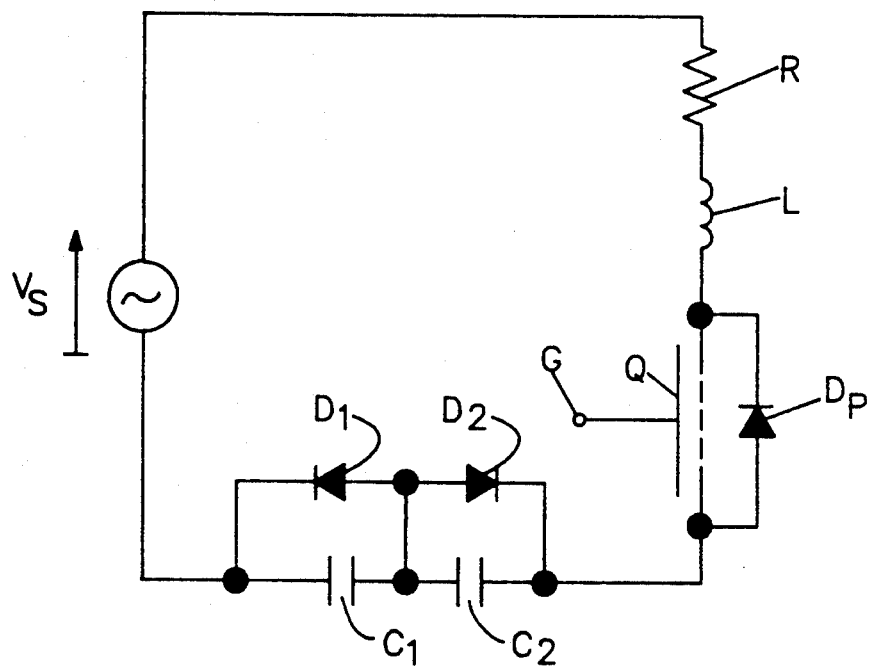

FIG. 3 shows an embodiment in accordance with the invention utilizing two electrolytic capacitors in series, $C_1$ and $C_2$. Each capacitor is shunted or bridged by a respective diode, $D_1$ and $D_2$, the diodes being, in effect "back to back". An appropriate value for each capacitor in an embodiment for operation at 60Hz is capacitance of $22\mu F$. Each diode protects its respective capacitor from being subjected to a wrong polarity voltage. When MOSFET transistor Q is turned OFF in a positive half cycle of the supply voltage $V_S$, capacitor $C_2$ remains charged at a maximum voltage equal to $\sqrt{2}.V_{RMS}$. Following turn-off, when $V_S$ is in a negative peak value of $V_S$, appears across capacitor $C_1$, which is equal to $\sqrt{2}.V_{RMS}+V_{peak}$ which equals $2\sqrt{2}.V_{RMS}$. Thus, capacitor $C_1$ becomes charged to $2\sqrt{2}.V_{RMS}$ and capacitor $C_2$ is discharged to zero. This charge redistribution takes place within a very brief portion of the first negative half cycle after turn-off. On turn-off, no power is supplied to the load and MOSFET transistor Q has applied across it a voltage equal to the charge voltage on capacitor $C_2$ plus the negative peak supply voltage which equals $2\sqrt{2}.V_{RMS}+V_{peak}$ which is $3\sqrt{2}.V_{RMS}$. By way of example, assuming that $V_S=24_{RMS}$, then power MOSFET transistor Q requires a breakdown voltage capability $BV_{SS}$ of at least $3\sqrt{2} \times 24V=99V$.

Figure 4:
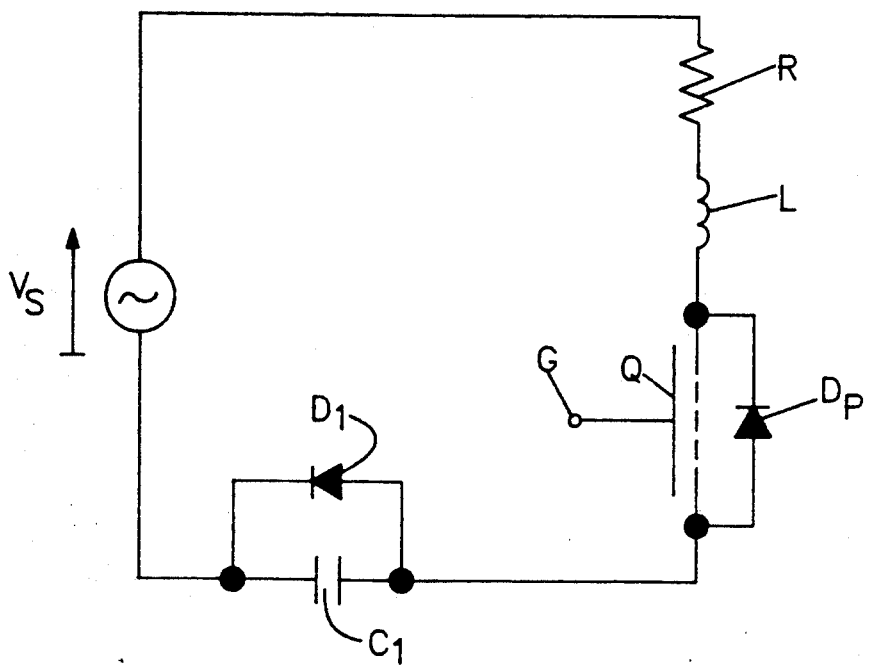

FIG. 4 shows another embodiment in which capacitor $C_2$ has been removed by being shorted out. In this arrangement, capacitor $C_1$ only gets charged during the negative half cycle when MOSFET transistor Q is ON and therefore is only charged to a voltage equal to $\sqrt{2}.V_{RMS}$. Accordingly, MOSFET transistor Q need only have a breakdown voltage capability $BV_{SS}$ of $\sqrt{2}.V_{RMS}+V_{peak}$. Using the previous example of $V_S=24V_{RMS}$, then power MOSFET transistor Q requires a breakdown voltage capability $BV_{SS}$ of only $2\sqrt{2} \times 24V = 66V$.

The application of a "MegaFET" MOSFET transistor in the present circuit is particularly advantageous since its ON-resistance is low and therefore does not unduly affect the power factor. The built-in ESD (electrostatic discharge) protection of such a MOSFET transistor is a further advantage, particularly where an inductive load is being driven, because of the possible occurrence of gate to source high voltage transients resulting, for example, from turn-off field decay in the load inductance.

FIGS. 5 through 8 show experimentally obtained results on circuits in accordance with the invention, using an inductive solenoid load. The voltage and current scales are indicated along the respective graph axes. FIGS. 5 and 6 show current and voltage waveforms for the load for the ON and OFF states, for the circuit of FIG. 3. FIGS. 7 and 8 show current and voltage waveforms for the power MOSFET transistor in a circuit corresponding to that of FIG. 4.

Figure 9:
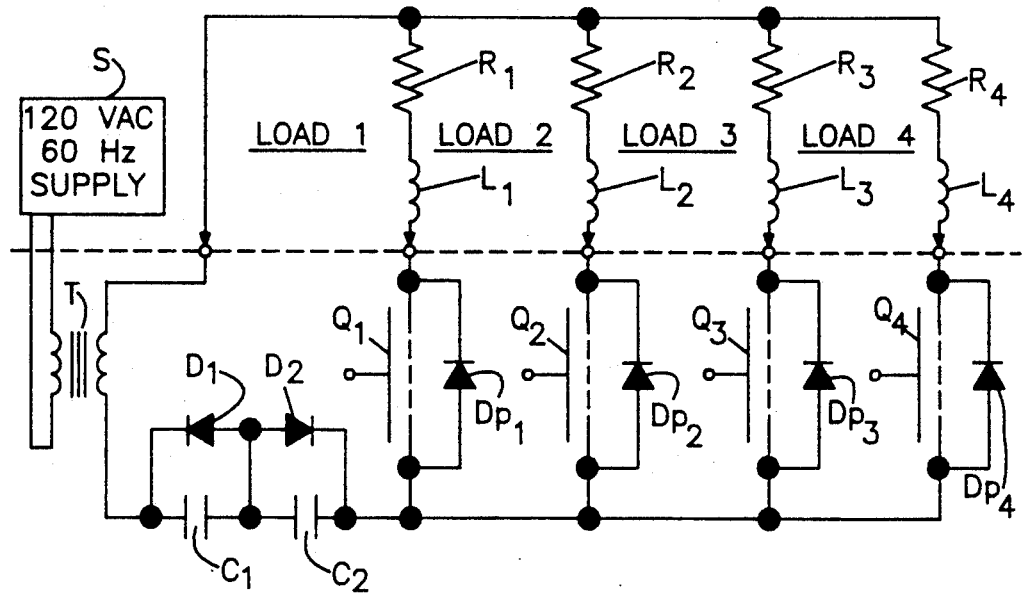

FIG. 9, corresponding to the circuit of FIG. 3, shows a multiple loop solenoid control circuit using MOSFET power transistors, in which any one of a plurality of loads may be driven at a time. Switching MOSFET transistors $Q_1$ through $Q_4$ control the application of an AC supply S via transformer T to a plurality of solenoid windings $L_1$ through $L_4$, respectively, having winding resistances $R_1$ through $R_4$, respectively.

Figure 10:
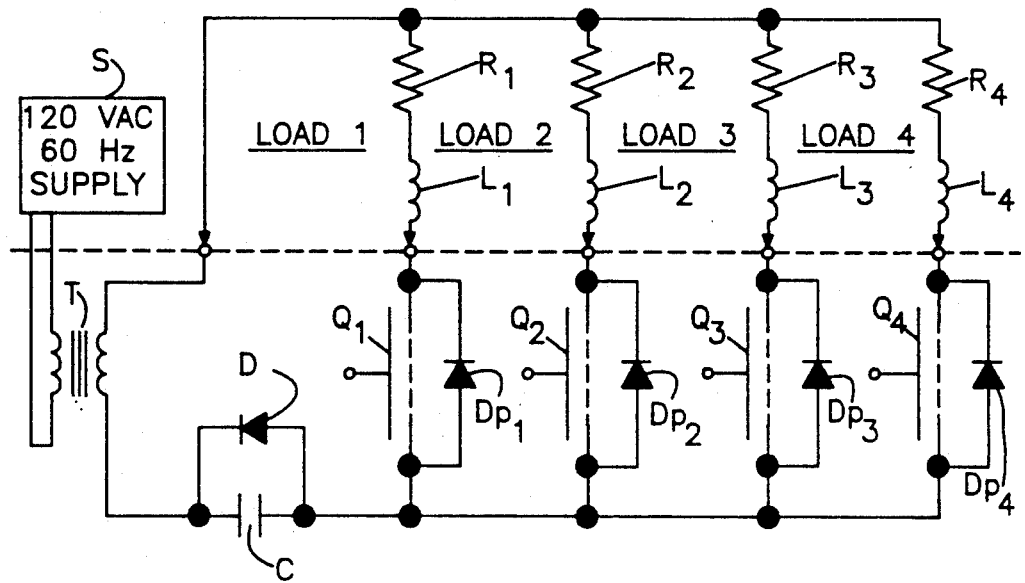

FIG. 10 shows another multiple loop solenoid control circuit corresponding to the circuit of FIG. 4 in which the MOSFET power transistors $Q_1$ through $Q_4$ have a lower breakdown voltage capability $BV_{SS}$ requirement.

The present invention has been described by way of exemplary embodiments. Various changes and modifications will become apparent to one skilled in the art, which changes and modifications are meant to be covered by the appended claims. For example, it is clear that, although circuit elements are illustrated as being connected in some particular order in a series circuit, the elements may be arranged in any other series connection order without causing thereby any material change in the circuit. Furthermore, while the illustrative embodiments disclosed herein are shown in terms of given polarities, conductivity types, diode directions of conduction, and inductive loads, such illustrative selections are not intended to limit the invention, as defined by the following claims.

---

APPENDIX
Typical design calculation, more particularly in reference to FIG. 1:

Assuming:
V = RMS supply voltage
I = RMS current rating of an inductive load
L = inductance of the load
R = resistance of the load
C = capacitance of the blocking network
$X_L$ = reactance of the load inductance L
$X_C$ = reactance of the blocking capacitor C
f = power supply frequency
Z = circuit impedance
< = symbol for vector angle in polar form -continued

Figure 2:
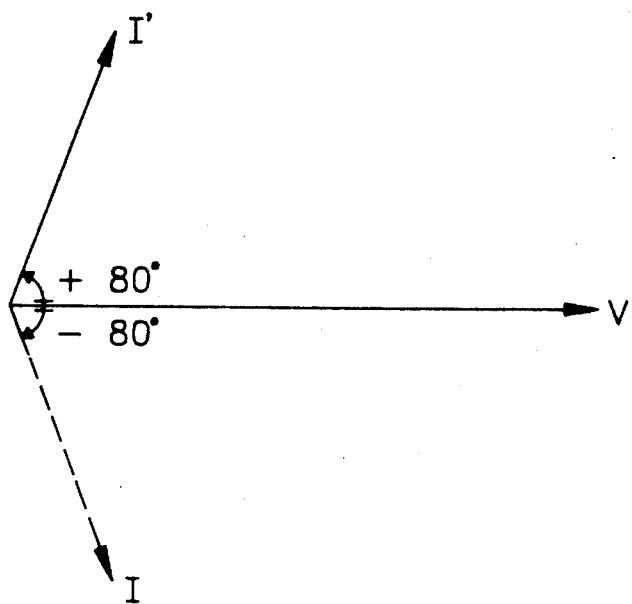
FIG. 2 shows a phasor diagram related to the description in the Appendix hereto.

APPENDIX
Typical design calculation, more particularly in reference to FIG. 1:

then
$Z = (V/I) < \cos^{-1}(R/Z)$ when no capacitance is connected;
also
$X_L = 2 \times 3.14 \times f \times L$
$Z = (R^2 + X_L^2)^{\frac{1}{2}}$
$X_L = (Z^2 - R^2)^{\frac{1}{2}}$
and with a capacitor in circuit,
$Z' = (R^2 + (X_L - X_C)^2)^{\frac{1}{2}}$, where $X_C = \frac{1}{2} \times 3.14 \times f \times C$
for the same value of I, without and with capacitance
$(R^2 + X_L^2)^{\frac{1}{2}} = R^2 + (X_L - XC)^{\frac{1}{2}}$
which gives $X_C = 2 X_L$.
For a solenoid rated for $24 V_{RMS}$ AC and a current rating of $0.25 A_{RMS}$,
$|Z| = 24/0.25 = 96$ ohms and phase angle $\cos^{-1}(R/Z)$
for $R = 20$ ohms, phase angle $\cos^{-1}(20/96) = 80°$
Therefore
$Z = 96 < 80°$ ohms and $X_1 = (96^2 - 20^2)^{\frac{1}{2}} = 94$ ohms
for $X_C = 2X_L = 2 \times 94 = 188$ ohms;
at 60 Hz, $C = \frac{1}{2} \times 3.14 \times 60 \times 188 = 14 \mu F$;
The new phase angle = $\tan^{-1}\{(-X_C - X_L)/R\} = \tan^{-1}(-94/20) = -80°$
Therefore $Z' = 96 < -80°$
For plotting the phasor diagram, the voltage vector is used as the reference and therefore
Current $I = V < 0°/Z < -80° = 24 < 0°/96 < 80° = 0.25 < -80°$ A, before connecting "C";
and after connecting "C",
$I' = V < 0°/Z < -80° = 24 < 0°/96 < -80° = 0.25 < +80°$ A.
The phasor diagram is shown in FIG. 2.

I claim:

1. A control circuit for coupling an AC (alternating current) source to a plurality of loads, comprising:
   a plurality of metal oxide semiconductor field effect transistors (MOSFETs), one MOSFET per load, each MOSFET having source and drain electrodes with a main conduction channel therebetween and a control electrode for controlling conduction in said main conduction channel, each MOSFET having one end of its conduction channel at a common node, and having the other end of its conduction channel connected to its corresponding load; and
   capacitor means having a first terminal for connection to said AC source and having a second terminal connected to said common node for forming a series circuit for selectively coupling said AC source to respective ones of said plurality of loands through respective ones of said plurality of MOSFETs, wherein said capacitor means includes at least a first capacitor connected between said first and second terminals, and a first diode coupled in parallel combination with said first capacitor.

2. A control circuit for coupling an AC source to a plurality of loads as recited in claim 1, wherein each of said MOSFET transistors exhibits a parasitic diode connected between said source and drain electrodes and said first diode is connected for conduction in an opposite polarity sense to that of said parasitic diodes.

3. A control circuit for coupling an AC source to a plurality of loads as recited in claim 1, wherein said capacitor means comprises a second capacitor connected in series with said parallel combination of said first diode and said first capacitor.

4. A control circuit for coupling an AC source to a plurality of loads as recited in claim 3, wherein said capacitor means comprises a second diode coupled in a parallel combination with said second capacitor.

5. A control circuit for coupling an AC source to a plurality of loads as recited in claim 4, wherein said first and second diodes are connected back to back for conduction in opposite directions of current flow.

* * * * *

UNITED STATES PATENT AND TRADEMARK OFFICE
CERTIFICATE OF CORRECTION

PATENT NO.   : 5,134,321
DATED        : July 28, 1992
INVENTOR(S)  : Pran N. Mehta It is certified that error appears in the above-identified patent and that said Letters Patent is hereby corrected as shown below:

<u>IN THE ABSTRACT</u>:

line 4, change "tor" to --tion--; and line 5, change "ibn" to --in--.

Column 3, line 52, before "peak" insert --half cycle, a voltage equal to the voltage on capacitor $C_2$ plus the negative--.

Signed and Sealed this

Fourteenth Day of September, 1993

*Attest:*

BRUCE LEHMAN

*Attesting Officer*  *Commissioner of Patents and Trademarks*